(12) United States Patent
Watson et al.

(10) Patent No.: US 7,566,579 B2
(45) Date of Patent: Jul. 28, 2009

(54) METHOD OF FABRICATING SEMICONDUCTOR DEVICES WITH A MULTI-ROLE FACILITATION LAYER

(75) Inventors: Ian Michael Watson, Glasgow (GB); Martin Dawson, Glasgow (GB); Erdan Gu, Glasgow (GB); Robert William Martin, Glasgow (GB); Paul Roger Edwards, Glasgow (GB)

(73) Assignee: University of Strathclyde, Glasgow (GB)

( * ) Notice: Subject to any disclaimer, the term of this patent is extended or adjusted under 35 U.S.C. 154(b) by 0 days.

(21) Appl. No.: 11/719,125

(22) PCT Filed: Nov. 4, 2005

(86) PCT No.: PCT/GB2005/004276

§ 371 (c)(1),
(2), (4) Date: Jul. 3, 2007

(87) PCT Pub. No.: WO2006/051272

PCT Pub. Date: May 18, 2006

(65) Prior Publication Data

US 2008/0067532 A1 Mar. 20, 2008

(30) Foreign Application Priority Data

Nov. 11, 2004 (GB) ................................ 0424957.9

(51) Int. Cl.
*H01L 21/00* (2006.01)
(52) U.S. Cl. .................... 438/46; 438/22; 438/602; 438/604; 438/E21.121
(58) Field of Classification Search ............. 438/22–24, 438/46–47, 48–56, 602–604; 257/79–86, 257/94
See application file for complete search history.

(56) References Cited

U.S. PATENT DOCUMENTS

| 6,924,159 B2 * | 8/2005 | Usui et al. ............... 438/22 |
| 2003/0178633 A1 | 9/2003 | Flynn et al. | |

FOREIGN PATENT DOCUMENTS

| JP | 07297476 A | 11/1995 |
| JP | 10242584 A | 9/1998 |

OTHER PUBLICATIONS

Dorsaz J. et al., InGaN/GaN resonant-cavity LED including an AlInN/GaN Bragg mirror, Physica Status Solidi A, Sep. 15, 2004, pp. 2675-2678, vol. 201 No. 12, Germany.

(Continued)

*Primary Examiner*—Dung A. Le
(74) *Attorney, Agent, or Firm*—Alston & Bird LLP (57) ABSTRACT

A method of growing semiconductor materials in the Indium, Aluminium, Gallium Nitride (InAlGaN) material system and to devices made therefrom, in particular optical devices in the ultraviolet to green region of the visible spectrum. Certain optical devices, for example Vertical Cavity Surface Emitting Lasers (VCSELs) require great precision in the thickness of certain semiconductor layers. One aspect of the present invention provides a gallium-rich group III nitride layer (200, 201) and an adjacent layer of $Al_xIn_yGa_{1-x-y}N$ layer (202). The $Al_xIn_yGa_{1-x-y}N$ layer (202) acts as a fabrication facilitation layer and is selected to provide a good lattice match and high refractive index contrast with the gallium-rich group III nitride layer (200, 201). The high refractive index contrast permits in-situ optical monitoring. The extra layer (202) can be used as an etch marker or etch stop layer in subsequent processing and may be used in a lift-off process.

28 Claims, 11 Drawing Sheets

OTHER PUBLICATIONS

Carlin J. F. et al., High-quality AlInN for high index contrast Bragg mirrors lattice matched to GaN, Applied Physics Letters, AIP, American Institute of Physics, Jul. 28, 2003, pp. 668-670, vol. 83 No. 4, Mellville, NY.

Watson et al., Use of AlInN layers in optical monitoring of growth of GaN-based structures on free-standing GaN substrates, Applied Physics Letters, Oct. 3, 2005, pp. 151901-1-3, vol. 87 No. 15, US.

Kim et al., ICP etching for the fabrication of AlGaInN with dielectric mirrors, Proceedings of International Workshop on Nitride Semiconductors, 2000, pp. 750-753, Japan.

Dorsaz et al., Selective oxidation of AlInN layers for current confinement in III-nitride devices, Applied Physics Letters, 2005, vol. 87 No. 072102.

Raja et al., Resonant Periodic Gain Surface-Emitting Semiconductor Lasers, IEEE Journal Of Quantum Electronics, Jun. 1989, vol. 25 No. 6, pp. 1500-1512.

Corzine et al., Design of Fabry-Perot Surface-Emitting Lasers with a Periodic Gain Structure, IEEE Journal of Quantum Electronics, Jun. 1989, vol. 25 No. 6, pp. 1513-1524.

Takeuchi et al., GaN-Based Light Emitting Diodes with Tunnel Junctions, Japanese Journal of Applied Physics, 2001, vol. 40, pp. L861-L863.

Bejtka et al., Roles for Aluminum Indium Nitride Insertion Layers in Fabrication of GaN-based Microcavities, Phys. Stat. Sol., 2003, pp. 1-5.

International Search Report for International App. No. GB2005/004276, 3 pages.

* cited by examiner

Figure 6 ns in the finished structure.
METHOD OF FABRICATING SEMICONDUCTOR DEVICES WITH A MULTI-ROLE FACILITATION LAYER The present invention relates to semiconductor materials in the Indium, Aluminium, Gallium Nitride (InAlGaN) material system. More specifically it relates to techniques for growing semiconductor layers with high accuracy and to devices fabricated by such techniques.

BACKGROUND TO THE INVENTION

Optical semiconductor devices in general, and Vertical Cavity Surface Emitting Lasers (VCSELs) in particular, have critical dimensions in their structures. Typically there will be several layers in such devices whose dimensions are related to the wavelength of the light at which they operate and that need to be grown to close tolerances.

In the case of photonic devices operating in the ultraviolet to green spectral region, the use of semiconductor materials in the InAlGaN material system is strongly favoured. Furthermore, high performance is favoured by growth of materials on gallium-rich group III nitride substrates or buffer layers. The shorter wavelengths of the light also mandate smaller semiconductor structures where greater control is required for the critical dimensions, especially in the vertical direction.

Many non-optical semiconductor devices also require great precision in the thickness of certain layers, especially as the geometries (the size of components and interconnections in the device) have shrunk.

SUMMARY OF INVENTION

According to a first aspect of the present invention, there is provided a semiconductor device fabricated from the AlInGaN material system, the device comprising at least a first gallium-rich group III nitride layer, at least a first $Al_xIn_yGa_{1-x-y}N$ layer (the "fabrication facilitation layer") adjacent the first gallium-rich group III nitride layer, and a further layer in the AlInGaN system adjacent to the first $Al_xIn_yGa_{1-x-y}N$ layer, wherein the values of x and y are such as to provide lattice-match to the first gallium-rich group III nitride layer such that the in plane strain is less than +/−1%, and wherein the first $Al_xIn_yGa_{1-x-y}N$ layer is such as to provide a detectable refractive index contrast with the at least one further layer in the AlInGaN material system or the first gallium-rich group III nitride layer.

In situ optical monitoring during semiconductor growth is known per se but only functions when there is sufficient refractive index contrast between adjacent layers to allow the interface to be detected. When gallium nitride (or similar) is grown on a gallium nitride (or similar) underlayer (such as a substrate, buffer layer, etc.) there is insufficient refractive index contrast. The provision of the $Al_xIn_yGa_{1-x-y}N$ layer (or fabrication facilitation layer) permits insitu optical monitoring to be conducted during fabrication. The refractive index contrast can be of any level provided it can be detected. However, preferably, it should be more than 2% and ideally more than 3%.

The proportion of aluminium $Al_xIn_yGa_{1-x-y}N$ layer is preferably five times that of Indium (in other words x=5y) to provide an appropriate lattice match to a GaN underlayer. The proportion of gallium may be low, or even nil. In a preferred gallium-free embodiment x+y=1 and y=0.17±0.02.

The lattice match between the $Al_xIn_yGa_{1-x-y}N$ layer and the at least one further layer in the AlInGaN material system may be such that the in plane strain is less than +/−1%. This reduces the likelihood of dislocations in the finished structure.

The device may comprise a cavity light emitter such as a VCSEL. Since these devices have critical dimensions they benefit particularly from the accuracy provided by the in situ monitoring. In such a device, the at least one further layer may be part of an active region. There will also be a top mirror above the active region and a bottom mirror. Examples of possible VCSEL structures include those with the bottom mirror adjacent the first $Al_xIn_yGa_{1-x-y}N$ layer or adjacent the further layer in the AlInGaN system depending upon the approach taken to etching.

In a typical VCSEL the first gallium rich group III nitride layer will comprise the substrate, although this is not essential as the fabrication facilitation layer can be used elsewhere in the fabrication of a device.

The value of x is preferably chosen such that the strain caused by lattice mismatch to the first gallium rich group III nitride layer is less than +/−0.25% in order to reduce the likelihood of any strain within the device structure.

The fabrication facilitation layer preferably has an optical thickness that is an odd-integer multiple of $\lambda/4$, where $\lambda$ is the chosen monitoring wavelength. Preferably, the thickness is approximately $\lambda/4$, which would be 68 nm at 600 nm.

The fabrication facilitation layer may provide a differential etch rate between itself and one or both of the adjacent layers composed from the AlInGaN material system. This permits the fabrication facilitation layer to further function as an etch stop layer.

A dielectric reflector may be located in a hole in either the first gallium-rich group III nitride layer or the further layer in the AlInGaN system.

According to a second aspect of the present invention there is provided a method of fabricating a semiconductor layer in the AlInGaN material system on a gallium-rich group III nitride layer, the method comprising growing a $Al_xIn_yGa_{1-x-y}N$ fabrication facilitation layer on a first surface of the gallium-rich group III nitride layer, growing at least one further layer in the AlInGaN material system above the fabrication facilitation layer while growth rate information is determined optically, wherein x and y are such as to provide lattice match with the gallium rich group III nitride layer such that the in plane strain is less than +/−1% and wherein the $Al_xIn_yGa_{1-x-y}N$ layer is such as to provide a detectable refractive index contrast with the at least one further layer in the AlInGaN material system or the first gallium-rich group III nitride layer.

The at least one further layer may be grown directly on the $Al_xIn_yGa_{1-x-y}N$ layer. The values of x and y may be such as to provide lattice match with the at least one further layer in the AlInGaN system such that the in-plane strain is less than +/−1%.

The growth of the at least one further layer may be conducted by using closed-loop control.

The fabrication facilitation layer may be formed of approximately 5 times as much Aluminium as Indium. Preferably, the facilitation layer comprises no gallium and x+y=1 and y=0.17±0.02.

The growth steps may be conducted using MOCVD for speed of processing but could equally be conducted using MBE with its attendant advantages of accuracy.

The method may involve growing a subsequent layer using the optically-derived growth rate information. The subsequent layer may be grown using a different growth regime to the layer above the fabrication facilitation layer or on a different substrate altogether. Calibration may be applied to account for variations in growth rate between the two regimes. A separate calibration may need to be performed to determine the calibration factor between the two regimes, possibly on a different wafer.

The fabrication facilitation layer may be used as an etch stop or etch marker layer, in for example a dry etch step. In this case, mass spectrometry or optical emission spectrometry may be used to detect the presence of ions from the fabrication facilitation layer.

Where a deep layer is to be etched, the etch step may be preceded by other, faster material removal techniques such as mechanical machining, for example mechanical grinding, and/or ablation based techniques, for example laser machining. The depth of the machining and/or dry etching can be determined using optical monitoring. A wet etch step may succeed the dry etch step (whether or not mechanical machining or ablation techniques are used) so as to remove the fabrication facilitation layer and leave a substantially flat surface. The wet etch may be an alkaline wet etch comprising, for example, a high-temperature solvent-free melt, exemplified by a eutectic mixture of sodium hydroxide (NaOH) and potassium hydroxide (KOH) at temperatures above 230° C., Alternatively, the facilitation layer may be etched using an acid based wet etch. An advantage of using an acid based etch is that such etches may cause less damage to other parts of the structure than corresponding alkaline etches. To allow an acid etch to be used, the method may further involve selectively converting areas of the $Al_xIn_yGa_{1-x-y}N$ fabrication facilitation layer exposed by the etching process to an oxide and etching the oxide using an acid based etch. Techniques for forming an oxide on $Al_xIn_yGa_{1-x-y}N$ are described by Dorsaz et al in Applied Physics Letters, Vol 87, 072102, 2005.

According to a third aspect of the present invention, there is provided a semiconductor device fabricated from the AlInGaN material system, the device comprising at least a first gallium-rich group III nitride layer, at least a first $Al_xIn_yGa_{1-x-y}N$ layer adjacent the first gallium-rich group III nitride layer and a further layer in the AlInGaN material system adjacent the $Al_xIn_yGa_{1-x-y}N$ layer, the device further comprising at least a dielectric reflector located in a hole in either the first gallium-rich group III nitride layer or the further layer in the AlInGaN material system, wherein the values of x and y are such as to provide lattice match to either the first gallium-rich group III nitride layer or the further layer in the AlInGaN system such that the in plane strain is less than +/−1%.

The proportion of Aluminium may be approximately 5 times the proportion of Indium, in other words x is substantially equal to 5y. Alternatively, x+y=1 and y=0.17+/−0.02.

The values of x and y may be such as to provide a lattice match to the other of the first Aluminium rich group III nitride layer and the further layer in the AlInGaN material system.

The semiconductor device may be a resonant cavity light emitting device such as a optically pumped or electrical injection VCSEL.

The hole in the semiconductor device may extend through the first $Al_xIn_yGa_{1-x-y}N$ layer.

The value of at least one of x and y is selected to provide an etch rate distinction between the $Al_xIn_yGa_{1-x-y}N$ layer and either the first gallium rich group III nitride layer or the further layer in the AlInGaN materials system.

According to a fourth aspect a method of selectively etching a first gallium rich group III nitride layer from a second gallium rich group III nitride layer, the method comprising growing a $Al_xIn_yGa_{1-x-y}N$ fabrication facilitation layer on a first surface of the first gallium-rich group III nitride layer; growing the second gallium rich group III nitride layer on the fabrication facilitation layer; etching one of the first gallium rich group III nitride layer and the second gallium rich group III nitride layer and terminating the etching process at the fabrication facilitation layer wherein x and y are such as to provide lattice match with at least one of the gallium rich group III nitride layers such that the in plane strain is less than +/−1%.

The etching may be terminated in response to detection of chemical species liberated from the fabrication facilitation layer. In other words, the fabrication facilitation layer further provides an etch marking function.

The etching may be terminated due to detection of differential etch rates between the fabrication facilitation layer and the one of the first and second gallium group III nitride layers. In other words the fabrication facilitation layer is additionally performing an etch stop function.

The fabrication facilitation layer may be further etched away. This may be performed using a wet etching technique such as an alkaline wet etch and is preferably used to provide a flat surface for deposition of the Distributed Bragg Reflector (DBR). The alkaline etch may comprise a high-temperature solvent-free melt, exemplified by a eutectic mixture of sodium hydroxide (NaOH) and potassium hydroxide (KOH) at temperatures above 230° C. Alternatively, the facilitation layer may be etched using an acid based wet etch. An advantage of using an acid based etch is that such etches may cause less damage to other parts of the structure than corresponding alkaline etches. To allow an acid etch to be used, the method may further involve selectively converting areas of the $Al_xIn_yGa_{1-x-y}N$ fabrication facilitation layer exposed by the etching process to an oxide and etching the oxide using an acid based etch. Techniques for forming an oxide on $Al_xIn_yGa_{1-x-y}N$ are described by Dorsaz et al in Applied Physics Letters, Vol 87, 072102, 2005.

A combination of machining, dry etching and wet etching may be performed but it is preferred that the etching step is a dry etching step.

According to a fifth aspect of the present invention, there is provided a method of etching a first gallium-rich group III nitride layer from a further gallium-rich group III nitride layer, the method comprising: growing a $Al_xIn_yGa_{1-x-y}N$ fabrication facilitation layer on a first surface of the first gallium-rich group III nitride layer; growing at least one further gallium rich group III nitride layer on the fabrication facilitation layer; penetrating one of the first gallium rich group III nitride layer and the further gallium rich group III nitride layer as far as the fabrication facilitation layer and etching the fabrication facilitation layer, wherein x and y are selected to provide lattice match with at least one of the gallium rich group III nitride layers such that the in plane strain is less than +/−1%.

The etching may be performed using a wet etch, such as an alkaline wet etch preferably in order to provide a flat layer for subsequent deposition. The etch step may be performed in an aqueous solution of an organic amine with chelating properties. These exhibit a very good level of etch selectivity. Examples of suitable amines include 1,2-diaminoethane and bis(2-aminoethyl)amine. Alternatively, the facilitation layer may be etched using an acid based wet etch. An advantage of this is that such etches may cause less damage to other parts of the structure than corresponding alkaline etches. To allow an acid etch to be used, the method may further involve selectively converting areas of the $Al_xIn_yGa_{1-x-y}N$ fabrication facilitation layer exposed by the etching process to an oxide and etching the oxide using an acid based etch. Techniques for forming an oxide on $Al_xIn_yGa_{1-x-y}N$ are described by Dorsaz et al in Applied Physics Letters, Vol 87, 072102, 2005.

The etch may effect a lift off of one of the gallium rich group III nitride layers.

Alternatively, or in addition, the penetrating step may comprise some form of mechanical machining, for example mechanical grinding and/or ablation based techniques, for example laser machining

BRIEF DESCRIPTION OF THE FIGURES

The present invention will now be described, by way of example, with reference to the accompanying drawings, in which.

DETAILED DESCRIPTION OF THE PREFERRED EMBODIMENTS

Figure 1:
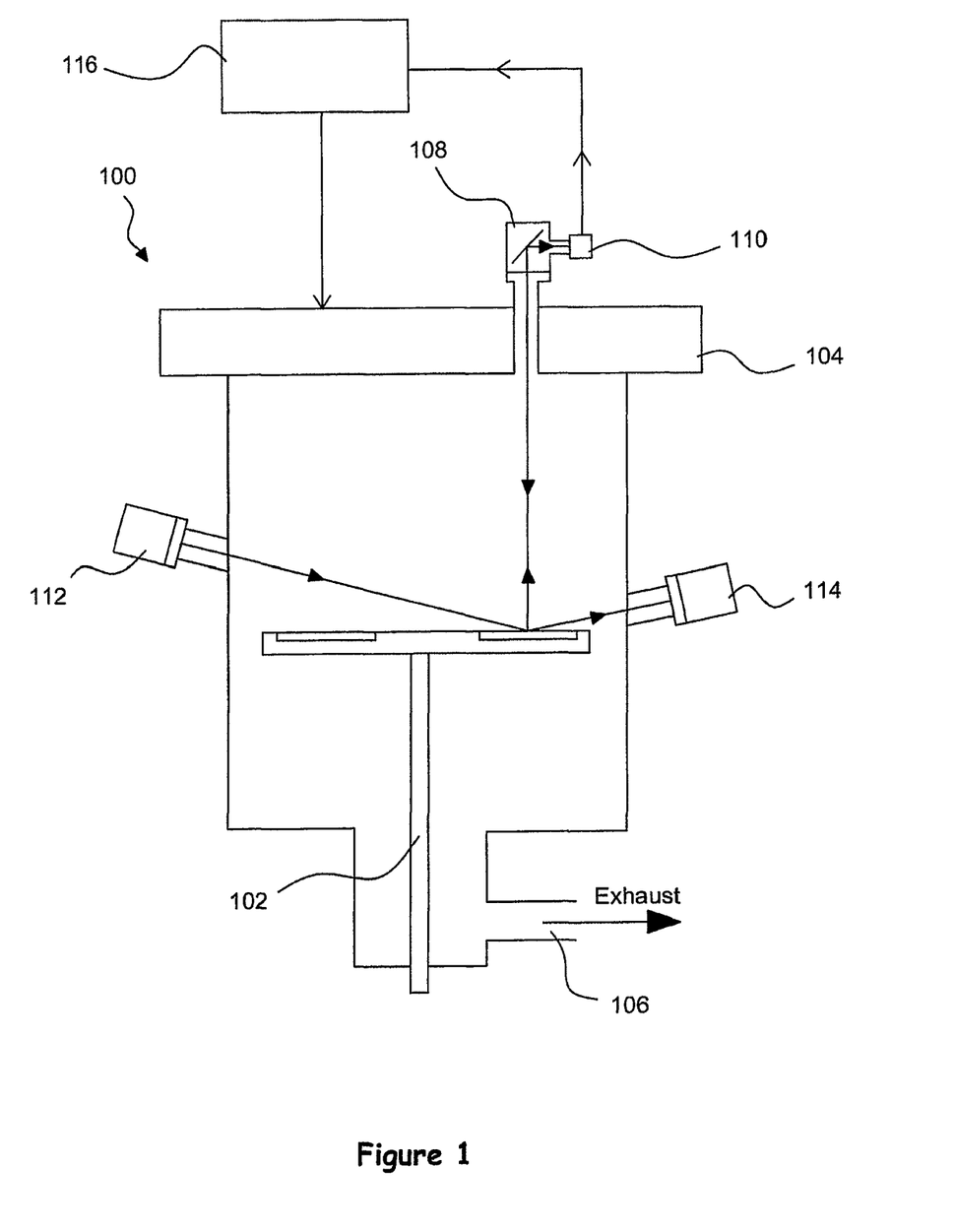
FIG. 1 shows a schematic diagram of a reactor suitable for practicing the methods of the present invention, and growing the layers and fabricating the devices of the present invention.

FIG. 1 shows a schematic diagram of a reactor 100, For the sake of clarity, only the in-situ optical monitoring components are shown in detail, but all of the standard features of a semiconductor reactor are included. The reactor 100 includes a rotating carrier assembly 102 for supporting wafers. Above the carrier, and directly above a point at which each of the wafers on the carrier will pass as the carrier rotates, is a reflectance light source 108. The source directs light downwards onto the carrier (and thus each wafer in turn). Some of the incident light will be reflected back to the source. The source includes a half-silvered mirror or other optical element to direct some of the reflected light to a reflectance detector 110. The signal detected here is then available to be used for measurement purposes and is also coupled to closed-loop growth controller 116 that controls, inter alia, the gas flows through the flow flange 104.

Also shown is an ellipsometry system with a source 112 and polarisation-sensitive detector 114. Ellipsometry offers the scope for determining thicknesses and compositions of thinner layers than can be monitored using more standard reflectometry, but data analysis is computationally intensive. However, this processing is available to the skilled person and measurements by ellipsometry are within the scope of the present invention.

Figure 2A:
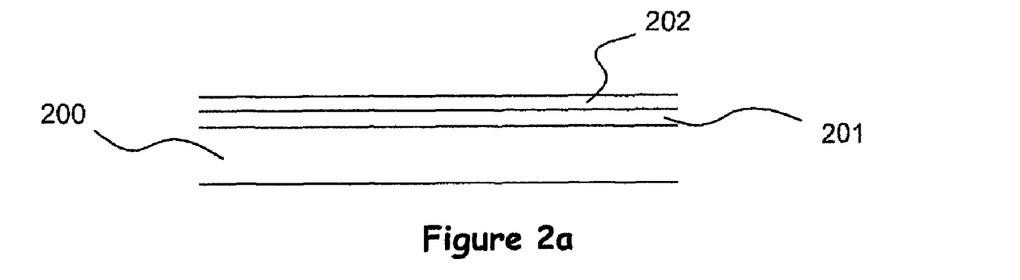
FIGS. 2(a) to (n) show schematic diagrams of fabrication of an optically pumped and electrical injection VCSEL in accordance with a first embodiment.

The growth of a VCSEL device for emission in the violet spectral region according to the first embodiment of the invention will now be described. FIG. 2(a) shows a gallium nitride substrate 200, typically 300 μm thick. The substrate typically comprises a lower layer that has been grown comparatively quickly (to provide cost-effective manufacture) and an upper layer that has been grown comparatively slowly (to provide a smooth surface for subsequent growth). Alternatively the lower layer could be a substrate of a different material such as sapphire. In FIG. 2(a) the smooth surface is shown uppermost. On this upper surface is grown a gallium nitride buffer layer 201 that has optical properties that are substantially the same as those of the gallium nitride substrate 200. This has a thickness of 1 micron. As will be appreciated, this layer 201 is optional. On the buffer layer 201 is an $Al_{0.83}In_{0.17}N$ layer 202 that is grown by MOVPE (also known as MOCVD). This provides a very good in-plane lattice match to gallium nitride. This good in plane lattice match was observed by J. F. Carlin and M. Ilegems in "High Quality AlInN for high index contrast Bragg mirrors lattice-matched to GaN" Applied Physics Letters Vol. 83, No. 4, page 668. Semiconductor growers try to obtain +/−0.1% lattice match although a wider range such as +/−0.25%, is permissible here. Strictly speaking the percentage relates to the conventional definition of epitaxial strain between a grown layer and the underlayer. In a preferred embodiment, temperature is used during the growth to control the Indium content. The proportion of Aluminium to Indium is preferably 5:1 or thereabouts to provide a low-strain lattice match to the gallium nitride. While a gallium-free layer is grown in this example, a proportion of gallium and other materials may be included in the lattice without introducing unacceptable levels of strain.

The layer 202 will hereinafter be referred to as a fabrication facilitation layer, because it allows certain measurements to be made that facilitate the growth of subsequent layers to accurate tolerances. It is also capable of performing other functions as described subsequently. While an Aluminium Indium Nitride layer is described, certain other materials may be substituted within the teaching of the present invention. A proportion of gallium may be included for example and it is possible to include other elements capable of adopting formal oxidation states of +3, such as scandium or yttrium, or elements capable of adopting formal oxidation states of −3 as substituents for nitrogen, without destroying the lattice match.

The fabrication facilitation layer 202 is 68 nm thick but a variation of +/−5 nm can readily be tolerated. This physical thickness represents an optical thickness of a quarter wavelength (λ/4) at the wavelength used in the reactor for in-situ monitoring purposes and provides a large amplitude for variations in reflectance during growth of subsequent layers, due to the refractive index being approximately 7% lower than gallium nitride. The strength of the modulation of the reflectance signal is greatest at thicknesses corresponding to odd integer multiples of λ/4 at the monitoring wavelength. As the thickness of the layer varies from this value, the strength of modulation of the reflectance signal diminishes. The allowable variation in thickness thus depends upon the noise of the measuring environment and the sensitivity of the optical receiving apparatus and will vary from case to case. Because the thickness of the growth facilitation layer is not particularly critical it can be grown either by reference to known growth rates in the reactor or by optically monitoring the growth. In a noisy environment it might be difficult to detect a quarter wavelength in the reflected signal but it will generally be possible to detect the signal with sufficient accuracy to control the growth, especially using available noise-reduction processing on the output signal. Control can be applied in response to the optical monitoring either manually or using closed-loop control to provide a predetermined thickness. Much thicker fabrication facilitation layers are possible but they will absorb more of the incident light, which means that, for a given light level, detection of the reflected signal may be compromised.

Figure 2B:
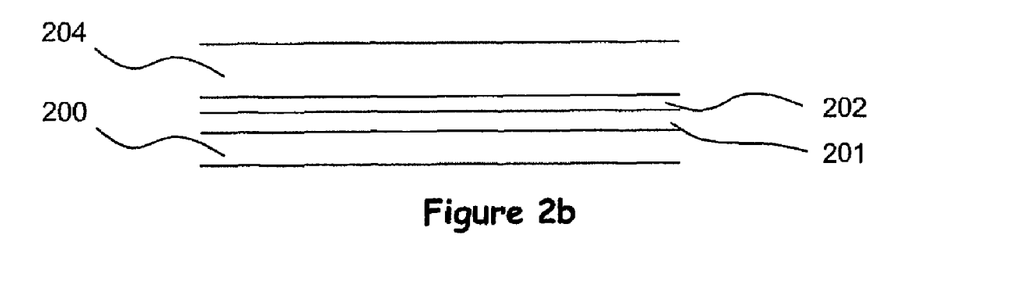

FIG. 2(b) illustrates the growth of the next gallium nitride layer 204 which will form part of the active region of the VCSEL. Specific layer thicknesses discussed in connection with FIGS. 2(b) to 2(j) assume that the device is designed for operation at 416 nm, at room temperature. This first example is an optically pumped VCSEL, which does not require any doping. The layer 204 defines the distance of the first quantum well in the active region from the substrate (that will be shown subsequently to hold the lower mirror of the VCSEL) and in this case is approx. 153 nm thick. The quantum wells are located at the antinodes of the electric field in the laser cavity but further theory behind the spacing, size and number of quantum wells is outside the scope of the present description. For further information the reader is referred to Resonant Periodic Gain Surface-Emitting Semiconductor Lasers by Raja et al or Design of Fabry-Perot Surface Emitting Lasers with a Periodic Structure by Corzine et al, both published in the IEEE Journal of Quantum Electronics, Vol. 25, No. 6, June 1999 at pages 1500 and 1513 respectively. The layer 204, being comparatively thick, is easy to measure to a high accuracy. This can be used to calibrate the reactor (amount of deposition against time) to permit the accurate growth of subsequent thin layers, either using normal control or closed-loop control. Subsequent thin layers may be grown under a different regime, for example low temperature growth as opposed to high temperature growth, so a prior calibration run may be required to determine the relationship between the regimes for a given reactor.

Figure 2C:
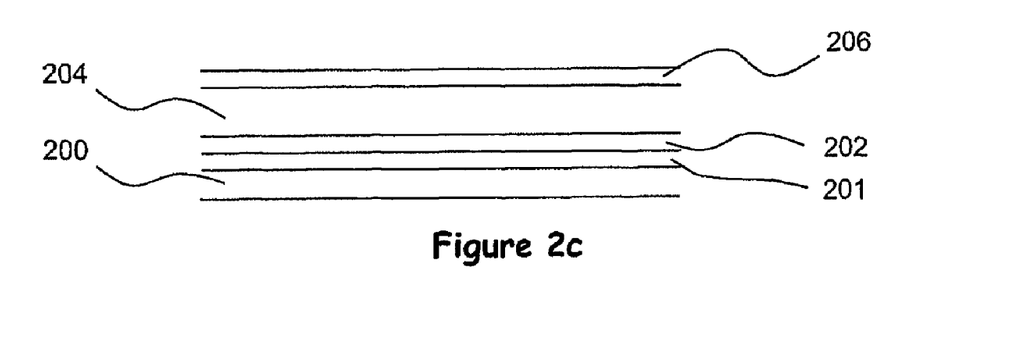
Figure 2D:
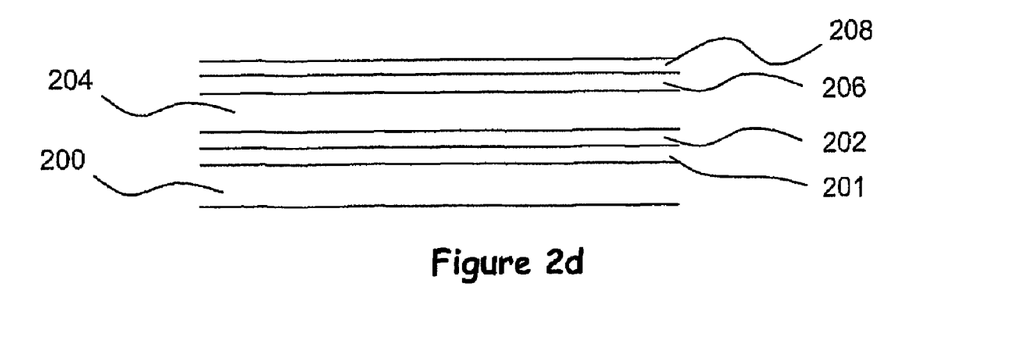
Figure 2E:
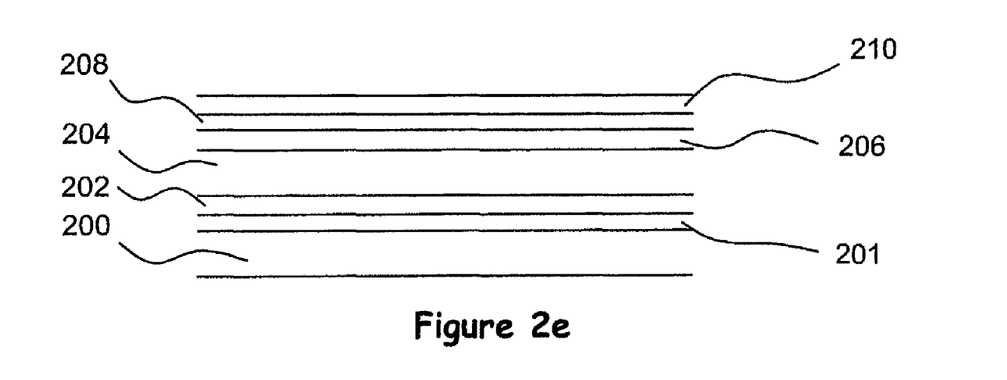
Figure 2F:
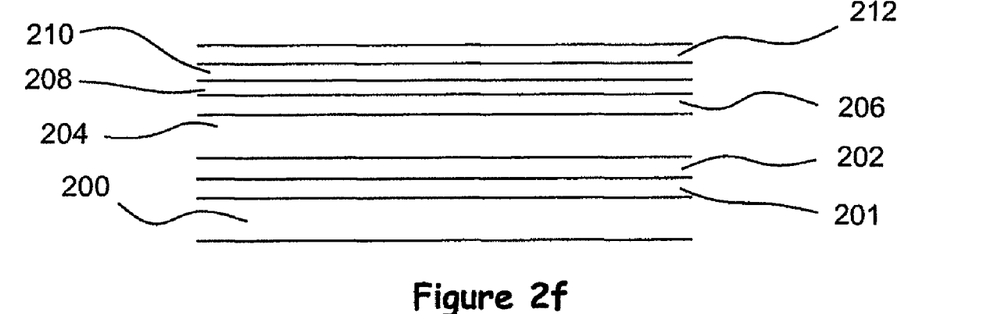

FIG. 2(c) shows the growth of a not intentionally doped (nid) InGaN layer 206 2.5 nm thick to form the first quantum well. The dimensions of the layers in the stack of quantum wells are particularly critical and the calibration of the reactor using the refractive index contrast provided by the layer 202 allows the growth of these layers with sufficient accuracy by controlling the durations of individual growth steps in an MOCVD process recipe. Grown on the InGaN layer 206 is a barrier layer 208 (on the first quantum well layer) which is a nid GaN layer of thickness 7 nm, as shown in FIG. 2(d). FIGS. 2(e) and 2(f) show the growth of further layers 210 and 212 that are identical to layers 206 and 208 respectively.

Figure 2G:
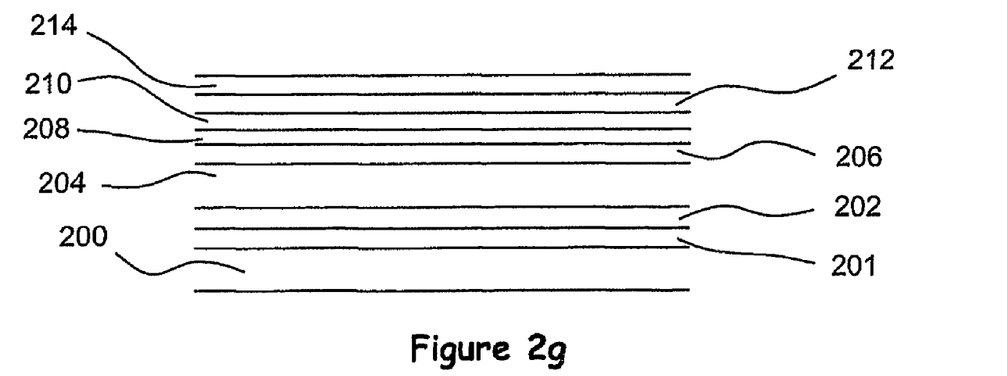
Figure 2H:
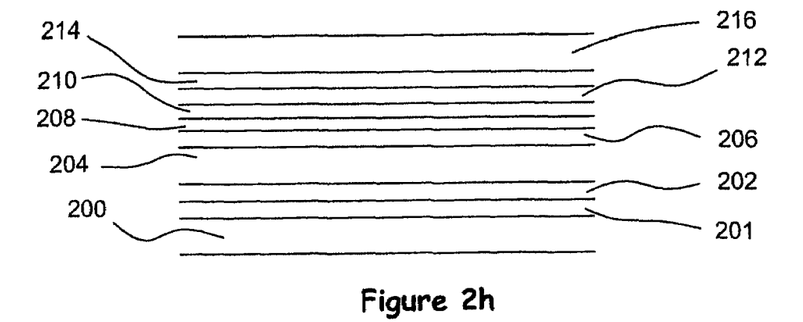
Figure 2J:
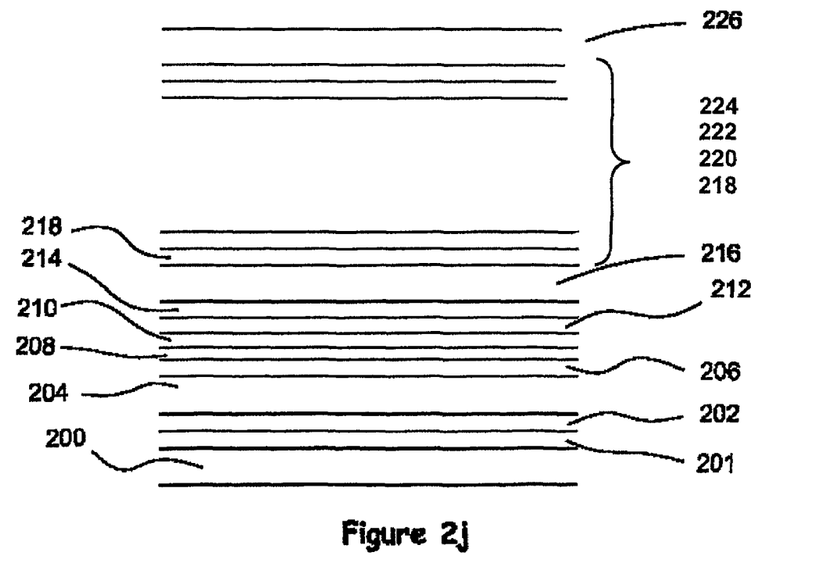

Layer 214 is shown in FIG. 2(g). This is a 2.5 nm InGaN layer to complete the first group of quantum wells. FIG. 2(h) shows the growth of an approximately 60 nm gallium nitride layer 216 upon which is grown the next group of quantum wells. The layer 216 may be any compatible alloy, which is substantially transparent and has good lattice match. However, the thickness of layer 216 will require adjustment if the refractive index of the alloy differs from that of gallium nitride. A further four groups of quantum wells designated as 218, 220, 222 and 224 are grown with the same dimensions and spacing as described above before a GaN layer 226 of approximately 71 nm is grown on top as shown in FIG. 2(j). These quantum wells are arranged to coincide with the electric field antinode positions in the optical cavity. It should be noted that, with certain mirror materials, the optical field within the device penetrates into the mirrors and so it is the effective cavity length that must be considered when dimensioning the device.

Figure 2K:
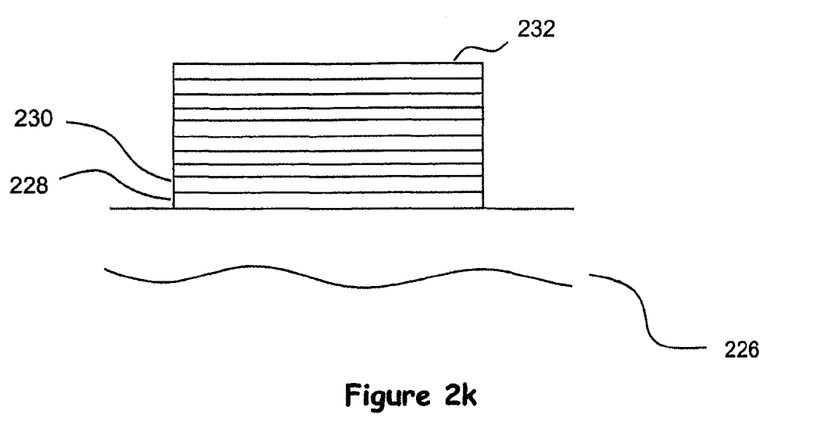

The wafer or wafers are then moved to a suitable reactor to grow or deposit a Distributed Bragg Reflector (DBR) on top of the layer 226. FIG. 2(k) shows the growth of the first mirror layer 228, the growth of the second mirror layer 230 after which the process is repeated to provide the complete mirror stack 232. The DBR layers require a high refractive index contrast such as $SiO_2/ZrO_2$ although other combinations known to the skilled person may be used. Electron beam evaporation is one suitable deposition technique.

Completion of the device structure discussed thus far to produce an optically pumped VCSEL requires deposition of a second DBR on the underside of the resonant cavity, that is, the lower surface of layer 204. Completion of the processing sequence requires either local or global removal of the substrate 200 and fabrication facilitation layer 202, to access the underside of layer 204. The processing steps required are similar to those employed in fabrication of an electrical injection device, which is now discussed as a variant on the present embodiment, and is illustrated by FIGS. 2(l) to 2(n).

The design of the cavity region of an optimised electrical injection device will differ in detail from that of an optically pumped device. In particular, a cavity containing only a single group of closely-spaced InGaN quantum wells as the active light-emitting region may be preferred. Also, to allow electron-hole recombination in the active region, doping of layers in the cavity is required, In the example illustrated in FIG. 2(l), layers grown above the active region are p-type, while layers grown below the active region are n-type. An optimised design may require additional functional layers with a high bandgap, whose primary role is carrier confinement, that is promotion of efficient electron-hole recombination in the active region. However, the thicknesses of all the individual layers, and positioning of the active region, must be adjusted in an analogous fashion to corresponding layers in the optically pumped VCSEL discussed above.

Figure 2L:
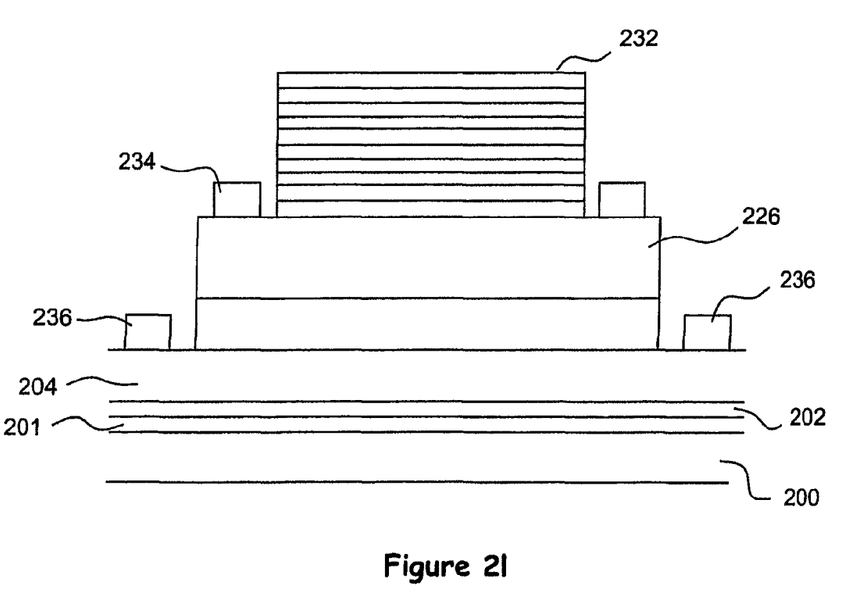

FIG. 2(l) shows an electrical injection VCSEL structure at the stage where the epitxial structure has been etched into a mesa, electrodes have been deposited, and a DBR has been deposited on the top surface of the epitaxial structure. The upper electrode 234 is a ring electrode surrounding the DBR 232. Because the layer 226 comprises p-doped GaN (which is a comparatively poor current conductor) and the top mirror is an insulator, a current spreader (not shown) is optionally included beneath the mirror. The second electrode 236 is a ring electrode located on layer 204. Because the layer 204 is n-doped GaN (a good current carrier) no current spreader is necessary here. Alternative techniques for current injection could be employed such as the tunnel junction arrangement, described in GaN-Based Light Emitting Diodes with Tunnel Junctions by Takeuchi et al, Japanese Journal of Applied Physics, volume 40, pp. L861-863, (2001). The tunnel junction contact arrangement has the advantage that both external contacts of the device are made to n-type layers, which are characterised by good current spreading properties, and favourable specific contact resistance values. A tunnel junction would typically be placed below the topmost n-type layer in the device to convert an electron current into a hole current, which is injected into the quantum well active region through a p-type layer.

Figure 2M:
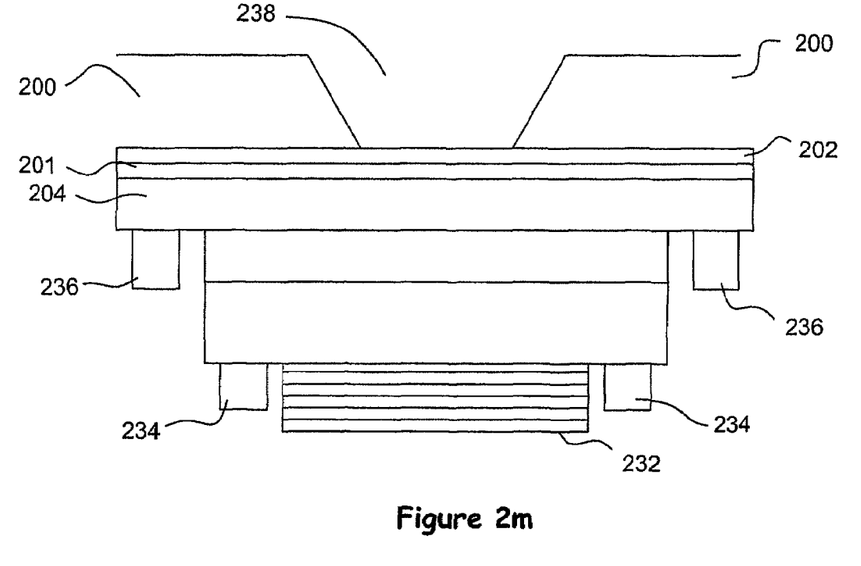
Figure 2N:
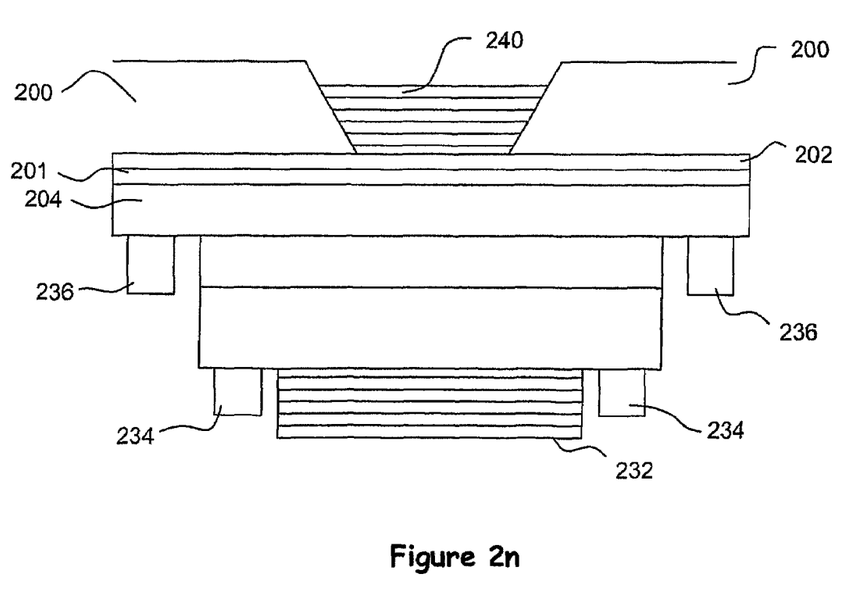

The wafer is then inverted to deposit the second mirror as shown in FIGS. 2(m) and 2(n). FIG. 2(m) shows a hole 238 etched in the substrate ready to insert the mirror. The fabrication facilitation layer 202 is used as an etch-stop layer or alternatively, as an etch marker layer to indicate that the etching process is complete (and the etching process is then terminated). The role as an etch marker layer could involve the use of mass spectrometry to detect Indium or Aluminium-containing species in the chamber of a plasma etching system as a result of the etching process having reached the layer 202. Another alternative is to capture the optical emission from the plasma and detect a spectral line for Indium or Aluminium, or a reduction in intensity of a spectral line for gallium, in the plasma in the reactor. In one embodiment, mechanical or laser machining is used to remove much of the substrate material while the process is completed by dry etching. Alternatively, a wet etch may be used to remove the fabrication facilitation layer and provide a smooth surface. Another technique is to use the in situ optical monitoring to detect the reduction of the thickness of the layer being etched, ie. employing reflectance versus time data to monitor the etch depth, in an inverse sense to the standard application of in situ reflectometry to monitor growth.

FIG. 2(n) shows the deposition of a second DBR 240. Many dielectric mirror combinations will work here such as $SiO_2/ZrO_2$ or $SiO_2/HfO_2$ etc. The structure will be coated (not shown) in known manner to encapsulate the device and determine which mirror the laser light passes through. Electrical connections to the electrodes will also be made.

An alternative manufacturing sequence may be employed after FIG. 2(j) in which the underside processing precedes electrode deposition. Stripes 238 (FIG. 2(m)) are machined and/or etched in the substrate and striped mirrors deposited. A lift-off technique (see FIG. 4) may be employed to expose the stripes. This order may be preferable to address alignment contamination and/or thermal budget issues. Other sequences of steps between the process step illustrated in FIG. 2(j) and the finished article can be used according to thermal budget and other fabrication issues.

Although the VCSEL described above is provided with a resonant periodic gain (RPG) structure, it will be appreciated that other structures may be used. In particular, the number of quantum wells in the active region may be varied. In addition, although a circular DBR stack is described in the foregoing VCSEL, it will be appreciated that other shapes such as ellipses, hexagons and so on may be used. Furthermore, whilst the fabrication facilitation layer is described as having an optical thickness of $\lambda/4$ ($\lambda$ being the wavelength of the light used for the in-situ monitoring), this is not critical and the technique works with different thicknesses. It could be grown using prior knowledge of deposition rates in the reactor or by analysing the reflectance signal as a function of time during growth of the fabrication facilitation layer. The calculation of cumulative layer thickness from reflectance versus time data is particularly straightforward if the reflectance signal contains a number of extrema, that is, corresponds to several complete optical cycles. However, the characteristic waveforms corresponding to growth of thinner layers can also be used to control thickness accurately, particular in the case of layers with a target optical thickness of multiples of $\lambda/4$, as illustrated in FIG. 3.

Figure 3:
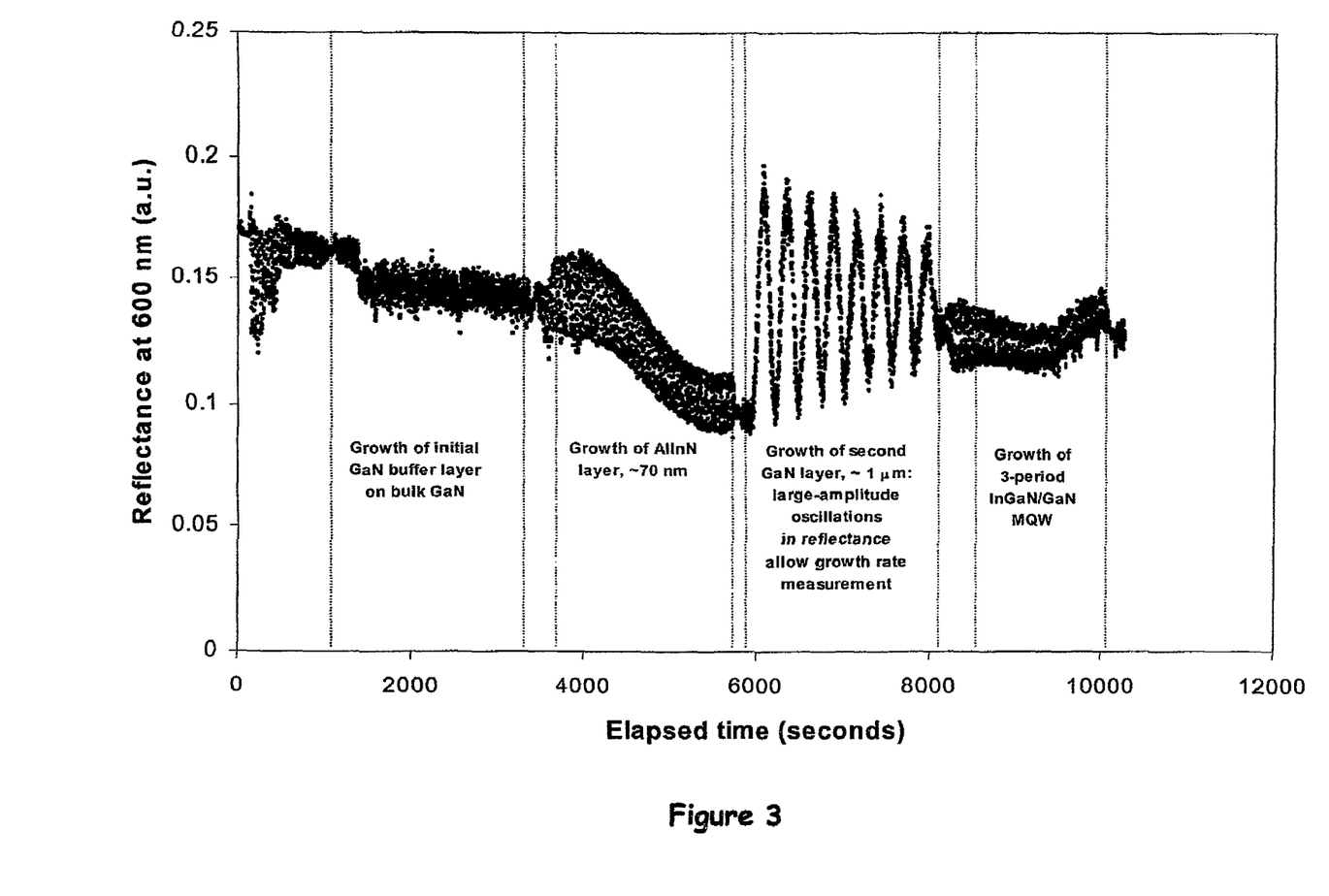
FIG. 3 shows a graph of reflectance against time for the growth of several semiconductor layers on gallium nitride, FIGS. 4(a) and (b) show schematic diagrams of a second embodiment.

FIG. 3 shows a graph of reflectance (relative scale) against time (in seconds) for growth of several layers in the InAlGaN material system by MOCVD. A piece of free-standing GaN was placed in the reactor and a GaN buffer layer was grown on the bulk GaN. Then a thin fabrication facilitation layer of $Al_{0.83}In_{0.17}N$ was grown using a slow, low temperature growth regime to a thickness of approximately 68 nm. Then a second GaN layer was grown using a faster, high temperature growth regime on the fabrication facilitation layer between approximately 6000 and 8000 seconds on the horizontal axis.

During the growth of the second GaN layer clear oscillations in the amplitude of the reflectance signal can be seen. These oscillations permit accurate measurement of the growth rate. This may be used to calibrate the reactor for the growth of the thin quantum well and barrier layers in the active region. A three period multiple quantum well is grown between approximately 8000 and 10000 seconds on the time axis. It can be seen that there is no readily discernable information in the graph between these times. Consequently the reactor growth rate needs to have been calibrated beforehand.

In a variation on the first embodiment, the reactor growth rate may be calibrated using one wafer having the fabrication facilitation layer and this growth rate information used to control subsequent growth on one or more wafers in further fabrication runs which do not have the facilitation layer. If the further functionality (etch stop or etch marker) of the fabrication facilitation layer is required then, naturally, it must be included.

Figure 4A:
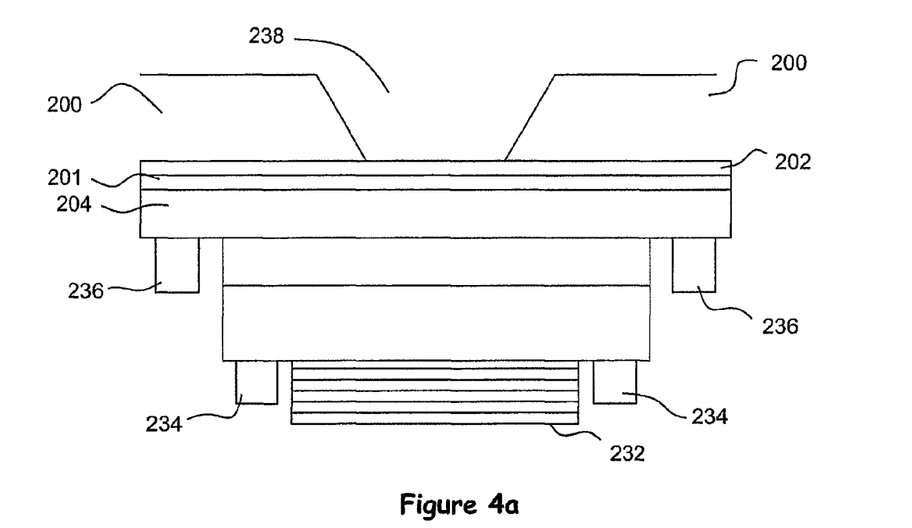
Figure 4B:
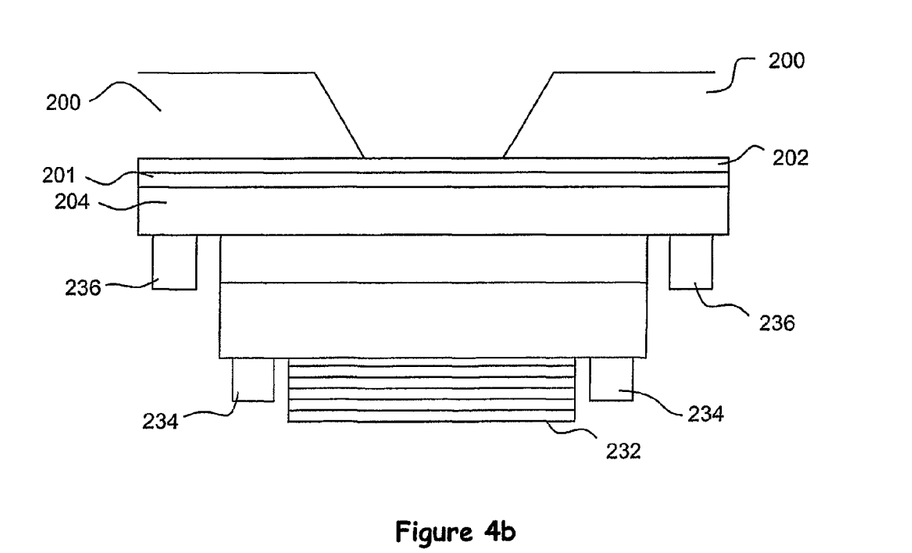
Figure 4C:
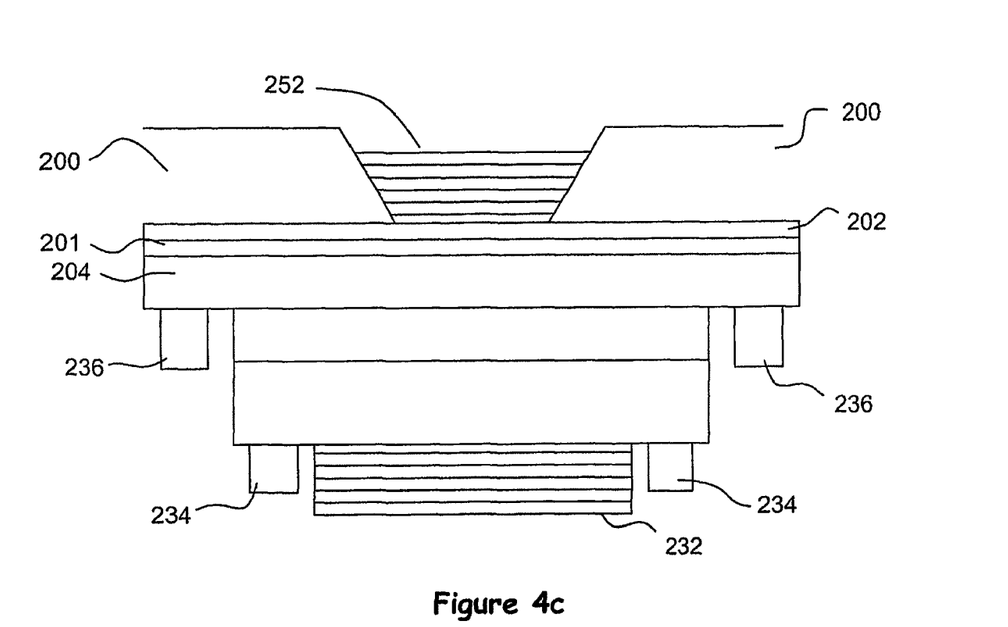

FIG. 4 shows another variation on the first embodiment that may also be provided separately as a second embodiment. After the dry etch step at FIG. 2(m) a further step is conducted before deposition of the DBR. It has been found that a wet alkaline etch (described in more detail below) provides good etch selectivity between the GaN layers and the fabrication facilitation layer, with the facilitation layer being removed. FIG. 4(a) corresponds with FIG. 2(m) and then a wet alkaline etch is conducted at FIG. 4(b) to expose the bottom surface of the layer 204. A DBR can then be deposited as before and as shown at FIG. 4(c). Again the precise order of the step can be varied to satisfy thermal budget and other fabrication issues. An advantage of this arrangement is that the active region of the VCSEL can be grown with great accuracy. Note that the active region will not now include the fabrication facilitation layer so the layer 204 will need to be correspondingly thicker.

Figure 5A:
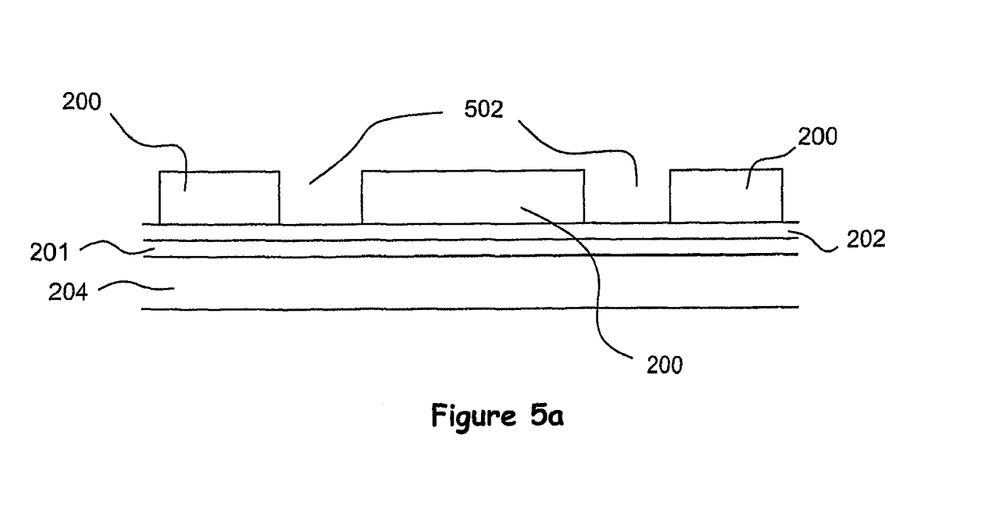
FIGS. 5(a) to (c) show the method and the result of a wet etch process suitable for process flows based on lift-off according to another embodiment.

FIG. 5 shows another embodiment that exploits the wet alkaline etch selectivity to provide lift off of a GaN layer. As before, two GaN layers are separated by a fabrication facilitation layer. FIG. 5(a) shows a series of holes or grooves 502 made in one of the GaN layers by, for example, laser machining or dry etching. The depth of the holes or grooves 502 must be sufficient to at least reach the top surface of the fabrication facilitation layer 202. They may optionally penetrate either part way or fully through the fabrication facilitation layer 202, into the lower GaN layer 204. The semiconductor is then subject to a wet etch which dissolves the fabrication facilitation layer 202 to provide lift-off of the layer 200. This can be used to expose a large area of a semiconductor layer prior to subsequent processing or (all of the layer) to provide a freestanding sample of GaN. As before the GaN layers may be a gallium rich group III nitride layers and the fabrication facilitation layer may include a small amount of gallium.

Figure 5B:
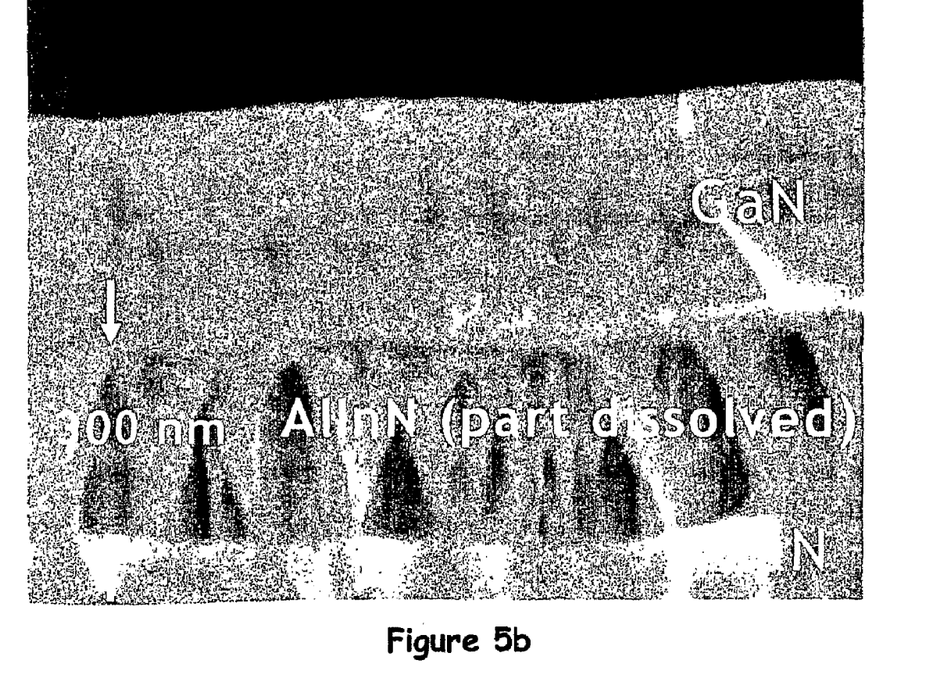
Figure 5C:
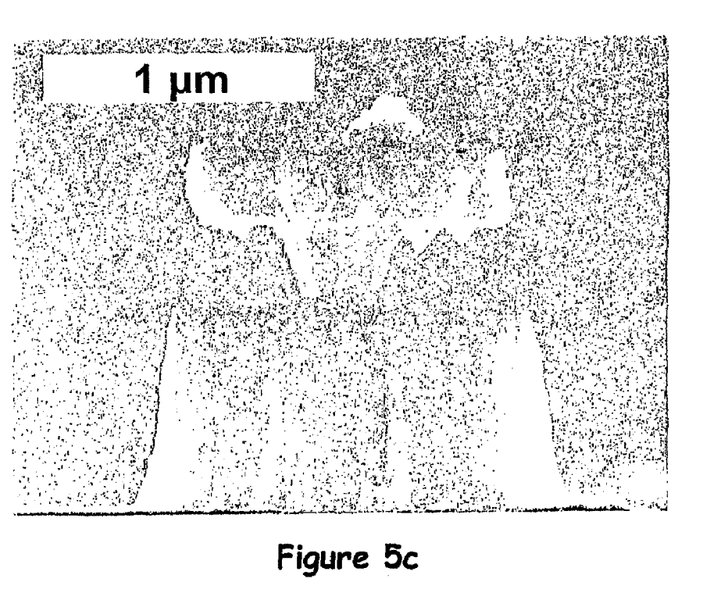

FIGS. 5(b) and 5(c) show secondary electron images which illustrate selective lateral etching into the lattice-matched AlInN layer of a GaN-AlInN-GaN trilayer structure grown on a sapphire substrate by MOCVD. This structure was processed into mesas using inductively coupled plasma etching, thereby exposing the AlInN layer on the mesa sidewalls. The wet etching was conducted in a 1 molar aqueous solution of 1,2-diaminoethane, at room temperature, for 24 hours, under standard laboratory illumination with fluorescent tubes. FIG. 5(b) illustrates the substantial lateral etching of the AlInN layer, combined with minimal etching the upper GaN layer, as required for a practical lift-off process. The residual AlInN has been etched into conical forms. The smooth nature of the visible area of the lower surface of the top GaN layer is significant, as the crystallographic orientation relationships applicable in this structure mean that it is the relatively reactive GaN (000-1) nitrogen face, which can be roughened under many other etch conditions. FIG. 5(c) provides a second illustration of the same process, but in which the wet etch step was continued for 72 hours. Here a cylindrical mesa has been etched into a pedestal structure, the central post of which is undissolved AlInN.

In both the techniques described with reference to FIGS. 4 and 5, alternative two-step approaches may be employed such as mechanical or laser machining followed by a dry etch or a dry etch followed by a wet etch. It is even possible to use mechanical machining or ablation based material removal techniques, then a dry etch up to the etch marker layer and then a (slower) wet etch through the fabrication facilitation layer to provide a smooth surface. In addition, as an alternative to using an alkaline wet etch, the facilitation layer may be etched using an acid based wet etch. An advantage of using an acid based etch is that such etches may cause less damage to other parts of the structure than corresponding alkaline etches. To allow an acid etch to be used, the method may further involve selectively converting areas of the $Al_xIn_yGa_{1-x-y}N$ fabrication facilitation layer exposed by the etching process to an oxide and etching the oxide using an acid based etch. Techniques for forming an oxide on $Al_xIn_yGa_{1-x-y}N$ are described by Dorsaz et al in Applied Physics Letters, Vol 87, 072102, 2005.

Figure 6:
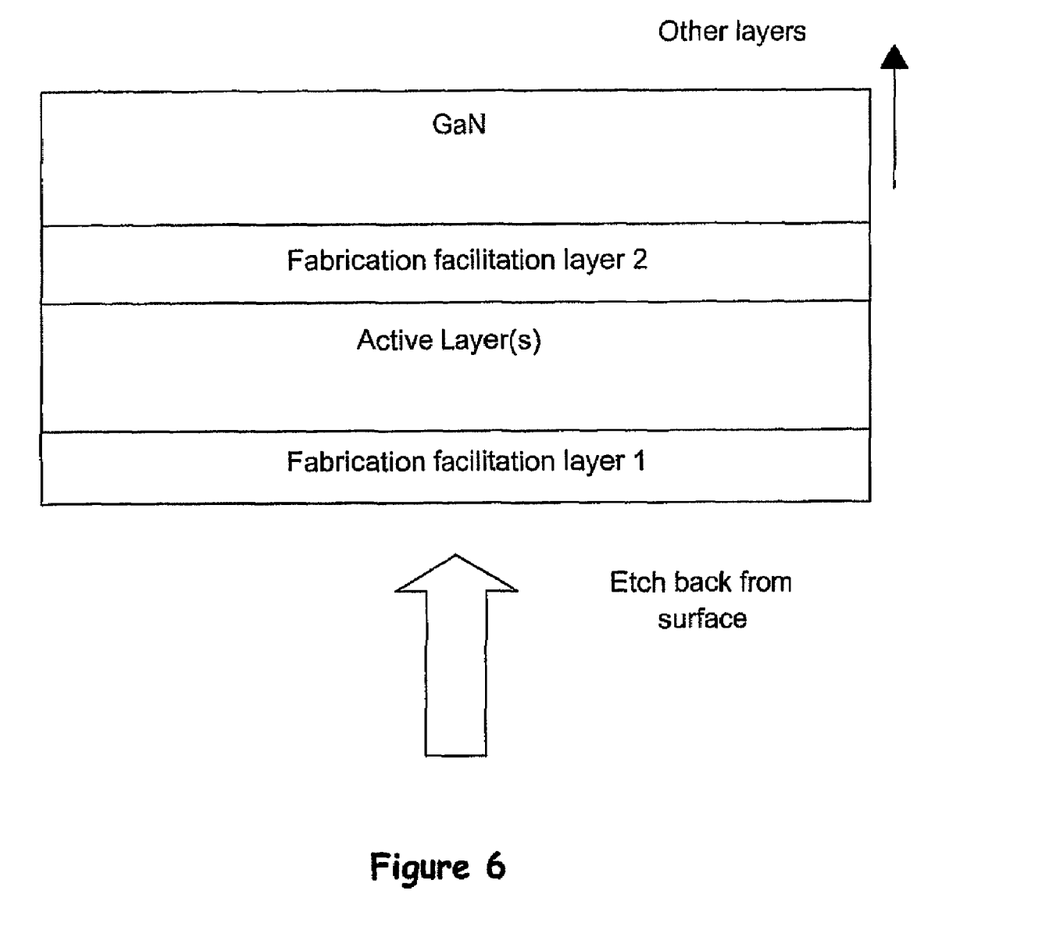
FIG. 6 shows schematic diagrams of fabrication of another device.

FIG. 6 illustrates yet another method in which the invention is embodied. In this case, two $Al_xIn_yGa_{1-x-y}N$ fabrication facilitation layers are provided, with an active layer of GaN based material sandwiched between them. Although not shown, other material, for example a GaN substrate would originally have been adjacent the lower of the fabrication layers, i.e. fabrication layer 1. In addition, other layers, such as the structures illustrated in FIGS. 2, 4 and 5 may be formed adjacent the upper fabrication facilitation layer, i.e. fabrication layer 1. In this example, the active layer has a thickness that is at least double the thickness of the fabrication facilitation layers. The lower of the two fabrication facilitation layers can be used to control the thinning of this structure from a back surface by providing an initial warning that the active GaN layer is being approached. This event could trigger a switch from, for example, a plasma etch process to processing steps that would remove surface roughness and/or offer a more controllable removal of material, such as a wet etch or chemomechanical polishing. In this case, any of the etch combinations described previously could be used. Such multi-stage thinning processes offer practical advantages, because techniques that allow fast removal of material often cause significant surface roughening. Chemomechanical polishing is an important example of a processing technique which can smooth a microscopically rough GaN surface, but offers relatively slow rates of stock removal, of order 1 micron per hour.

While the examples above are based upon a GaN substrate, this need not be the case in practice. Firstly, another material composition in the AlInGaN quaternary system might be used that has a similar in-plane lattice constant to GaN (typically a semiconductor material containing a small proportion of Aluminium or Indium) for example a Ga-rich group III nitride such as a AlInGaN quaternary alloy. Secondly, while a sapphire substrate, for example, will provide a refractive index contrast for optical in-situ monitoring, the strength of the signal diminishes with distance between the top surface of the sample and the interface between the sapphire and first semiconductor layer. At greater distances from the substrate, the reflected signal will eventually be lost in the noise. If this occurs then it would be possible to provide another growth facilitation layer higher up in the structure to permit accurate growth of layers at the top of the structure. This will be governed to some extent by the wavelength of the light used to perform the in-situ monitoring. Light with a wavelength of 600 nm penetrates better than shorter wavelength light although the thickness of the fabrication facilitation layer will need to be adjusted accordingly. Furthermore, an alternative (or pseudo) substrate comprises a (approximately 10 μm) layer of gallium nitride on, for example, a sapphire substrate. While the boundary between the sapphire and the gallium nitride may be detectable using in-situ optical monitoring, the strength of the signal will diminish as the thickness of GaN increases. In this circumstance, a fabrication facilitation layer will still be advantageous.

In the examples above, the growth was conducted using MOCVD. However, other growth techniques are possible such as Molecular Beam Epitaxy (MBE). MBE generally has a more predictable (albeit slower) growth rate than MOCVD so it might be possible to grow the active region in a VCSEL using MBE without requiring optical monitoring. However, the use of the growth facilitation layer for either stopping an etch process or detecting when such a process should be stopped would still apply. The modified technique of the second embodiment could also be applied to remove the fabrication facilitation layer using a wet etch.

A skilled person will appreciate that variations of the disclosed arrangements are possible without departing from the invention. For example, whilst the $Al_xIn_yGa_{1-x-y}N$ fabrication facilitation layer is described as being a single layer, it could be implemented as multiple layers, for example as a superlattice structure. Equally, rather than having a uniform composition, the fabrication facilitation layer could have a composition that varies across its thickness. As a specific example, the facilitation layer could include a variable amount of Ga, for example gradually increasing away from the first gallium-rich group III nitride layer. Accordingly, the above description of a specific embodiment is made by way of example only and not for the purposes of limitations. It will be clear to the skilled person that minor modifications may be made without significant changes to the operation described.

The invention claimed is:

1. A method of fabricating a semiconductor layer in the InAlGaN material system on a gallium-rich group III nitride layer, the method comprising:
   growing a $Al_xIn_yGa_{1-x-y}N$ fabrication facilitation layer on a first surface of the gallium-rich group III nitride layer,
   growing at least one further layer in the InAlGaN material system above the fabrication facilitation layer while growth rate information is determined optically,
   wherein x and y are so as to provide lattice match with the gallium rich group III nitride layer such that the in plane strain is less than +/−1% and wherein the $Al_xIn_yGa_{1-x-y}N$ layer is so as to provide a detectable refractive index contrast with the at least one further layer in the AlInGaN material system or the first gallium-rich group III nitride layer.

2. A method as claimed in claim 1, wherein the at least one further layer is grown on the $Al_xIn_yGa_{1-x-y}N$ layer.

3. A method as claimed in claim 1, wherein the values of x and y in the $Al_xIn_yGa_{1-x-y}N$ layer are also so as to provide at least a second lattice-match with the at least one further layer in the AlInGaN system such that the in plane strain is less than +/−1%.

4. A method as claimed in claim 1, wherein the value of x is substantially 5y.

5. A method as claimed in claim 4, wherein x+y=1 and y=0.17 +/−0.02.

6. A method as claimed in claim 1 further comprising growth of a subsequent layer in response to the growth rate information.

7. A method as claimed in claim 6, wherein the subsequent layer is grown in a different growth regime from the at least one further layer.

8. A method as claimed in claim 7, wherein a prior calibration run is performed to determine the relationship between the two growth regimes.

9. A method as claimed in claim 1 wherein at least the growth of the at least one further layer is controlled by closed loop control.

10. A method as claimed in claim 1, wherein growth rate information is determined optically during the growth of the fabrication facilitation layer.

11. A method as claimed in claim 1, wherein the fabrication facilitation layer has an optical thickness of substantially an odd integer multiple of □/4, where □ is the wavelength of the light used for the optical monitoring.

12. A method as claimed in claim 1, further comprising etching one of the gallium rich group III nitride layer and the further layer in the AlInGaN material system using the fabrication facilitation layer as an etch stop layer.

13. A method as claimed in claim 1, further comprising etching one of the gallium rich group III nitride layer and the further layer in the AlInGaN material system using the fabrication facilitation layer as an etch marker layer.

14. A method as claimed in claim 12, wherein the etching step is a dry etching step.

15. A method as claimed in claim 14, further comprising a wet etching step.

16. A method as claimed in claim 12, wherein the etching step is a wet etching step and the method further comprises a machining step conducted before the etching step.

17. A method as claimed in claim 12, wherein the termination of the etching step is detected by the presence of ions liberated from the fabrication facilitation layer.

18. A method as claimed in claim 1, wherein the optically-derived growth rate information is used to control the growth rate of a still further layer on a different wafer.

19. A method of selectively etching a first gallium rich group III nitride layer from a second gallium rich group III nitride layer, the method comprising growing a $Al_xIn_yGa_{1-x-y}N$ fabrication facilitation layer on a first surface of the first gallium-rich group III nitride layer, growing the second gallium rich group III nitride layer on the fabrication facilitation layer, etching one of the first gallium rich group III nitride layer and the second gallium rich group III nitride layer and terminating the etching process at the fabrication facilitation layer wherein x and y are so as to provide lattice match with at least one of the gallium rich group III nitride layers such that the in plane strain is less than +/−1%.

20. A method as claimed in claim 19, wherein the etching is terminated in response to detection of chemical species liberated from the fabrication facilitation layer.

21. A method as claimed in claim 19, wherein the etching is terminated due to differential etch rates between the fabrication facilitation layer and the one of the first and second gallium rich group III nitride layers.

22. A method as claimed in claim 19, further comprising etching away the fabrication facilitation layer.

23. A method as claimed in claim 19, wherein the etching step is a dry etching step.

24. A method of etching a first gallium-rich group III nitride layer from a further gallium-rich group III nitride layer, the method comprising:

growing a $Al_xIn_yGa_{1-x-y}N$ layer fabrication facilitation layer on a first surface of the first gallium-rich group III nitride layer, growing at least one further gallium rich group III nitride layer on the fabrication facilitation layer, penetrating one of the first gallium rich group III nitride layer and the further gallium rich group III nitride layer as far as the fabrication facilitation layer and etching the fabrication facilitation layer, wherein x and y are so as to provide lattice match with at least one of the gallium rich group III nitride layers such that the in plane strain is less than +/−1%.

25. A method as claimed in claim 24, wherein the etching is performed using an alkaline wet etch.

26. A method as claimed in claim 25, wherein the etch comprises a high-temperature solvent-free melt.

27. A method as claimed in claim 24, wherein the penetrating step includes mechanical machining and/or an ablation technique, so as laser machining.

28. A method as claimed in claim 27, wherein the penetrating step further comprises a dry etch step with end point detection.

* * * * *